(12) United States Patent
Keeney-Ritchie (10) Patent No.: US 11,067,423 B2
(45) Date of Patent: Jul. 20, 2021

(54) TEMPERATURE COMPENSATION OF A TEST TONE USED IN METER VERIFICATION

(71) Applicant: Micro Motion, Inc., Boulder, CO (US)

(72) Inventor: Miles Keeney-Ritchie, Boulder, CO (US)

(73) Assignee: Micro Motion, Inc., Boulder, CO (US)

( * ) Notice: Subject to any disclaimer, the term of this patent is extended or adjusted under 35 U.S.C. 154(b) by 168 days.

(21) Appl. No.: 16/461,082

(22) PCT Filed: Nov. 30, 2016

(86) PCT No.: PCT/US2016/064081
§ 371 (c)(1),
(2) Date: May 15, 2019

(87) PCT Pub. No.: WO2018/101920
PCT Pub. Date: Jun. 7, 2018

(65) Prior Publication Data
US 2019/0316944 A1    Oct. 17, 2019

(51) Int. Cl.
*G01F 1/84* (2006.01)
*G01F 15/02* (2006.01)
(Continued)

(52) U.S. Cl.
CPC .......... *G01F 1/8431* (2013.01); *G01F 1/8422* (2013.01); *G01F 1/8436* (2013.01);
(Continued)

(58) Field of Classification Search
CPC .... G01F 1/8431; G01F 1/8422; G01F 1/8436; G01F 15/024; G01F 25/0007;
(Continued)

(56) References Cited

U.S. PATENT DOCUMENTS 3,811,328 A    5/1974   Rodgers et al.
4,684,876 A    8/1987   Creel
(Continued)

FOREIGN PATENT DOCUMENTS

EP    0317340 A2    5/1989
EP    0317340 A3    8/1990
(Continued)

OTHER PUBLICATIONS

Rensing, Matthew, et al., Coriolis Flowmeter Verificiation via Embedded Modal Analysis, Presented at IMAC XXVIII, Feb. 1-4, 2010, Jacksonville, Florida USA, Copyright 2010 Society for Experimental Mechanics, Inc., Emerson Process Management [retrieved Dec. 24, 2015]. Retrieved from the Internet: <URL: https://www.emerson.com/documents/automation/white-paper-coriolis-flowmeter-verification-via-embedded-modal-analysis-micro-motion-en-64392.pdf>.
(Continued)

*Primary Examiner* — Akm Zakaria
(74) *Attorney, Agent, or Firm* — The Ollila Law Group LLC (57) ABSTRACT

A method for temperature compensation of a test tone used in meter verification is provided. The method uses a drive amplifier to provide a drive signal to a drive circuit, wherein the drive circuit includes a drive mechanism in a meter assembly of a vibratory meter. The method measures a first maximum amplitude of the drive signal at a first temperature of the drive circuit, and measures a second maximum amplitude of the drive signal at a second temperature of the drive circuit. The method also determines a maximum amplitude-to-temperature relationship for the drive circuit based on the first maximum amplitude at the first temperature and the second maximum amplitude at the second temperature.

18 Claims, 8 Drawing Sheets

(51) Int. Cl.
  *G01F 25/00* (2006.01)
  *G01R 19/04* (2006.01)
  *G01R 19/32* (2006.01)

(52) U.S. Cl.
  CPC ........ *G01F 15/024* (2013.01); *G01F 25/0007* (2013.01); *G01R 19/04* (2013.01); *G01R 19/32* (2013.01)

(58) Field of Classification Search
  CPC ........... G01R 19/32; G01R 19/04; H03L 1/02; H03L 1/026; H03L 1/028; H03F 2200/468
  See application file for complete search history.

(56) References Cited

U.S. PATENT DOCUMENTS

| | | | |
|---|---|---|---|
| 5,748,037 A | 5/1998 | Rozental et al. | |
| 6,526,839 B1 | 3/2003 | Barger et al. | |
| 7,904,268 B2 | 3/2011 | Wheeler et al. | |
| 8,467,986 B2 * | 6/2013 | Henry | G01F 1/849 702/100 |
| 2007/0086595 A1 * | 4/2007 | Asada | H04S 7/301 381/59 |
| 2011/0099764 A1 | 5/2011 | Policicchio et al. | |
| 2011/0178738 A1 | 7/2011 | Rensing et al. | |
| 2013/0121376 A1 | 5/2013 | Mansfield | |
| 2014/0067270 A1 | 3/2014 | Gail et al. | |
| 2018/0041217 A1 * | 2/2018 | Murakami | H03B 5/364 |

FOREIGN PATENT DOCUMENTS

| | | | |
|---|---|---|---|
| EP | 0317340 B1 | 8/1993 | |
| EP | 1091196 A2 | 4/2001 | |

OTHER PUBLICATIONS

Periodic Verification & Calibration of Micro Motion Coriolis Flow Meters [online]. Emerson Process Management, Jun. 20, 2013 [retrieved on Dec. 24, 2015]. Retrieved from the Internet: <URL: https://emersonexchange365.com/products/measurement-instrumentation/m/flow-mediagallery/2335/download>.

Cunningham, Tim et al., Using Structural Integrity Meter Verification to Verify Coriolis Flowmeters. Micro Motion Whitepaper, Emerson Process Management, WP-00948 [serialonline], 2007 [retrieved Dec. 8, 2015]. Retrieved from the Internet: <URL: https://www.emerson.com/documents/automation/white-paper-using-structural-integrity-meter-verification-to-track-corrosion-in-coriolis-flowmeters-micro-motion-en-66236.pdf>.

* cited by examiner

TEMPERATURE COMPENSATION OF A TEST TONE USED IN METER VERIFICATION

TECHNICAL FIELD

The embodiments described below relate to meter verification and, more particularly, to performing temperature compensation of a test tone used in meter verification.

BACKGROUND OF THE INVENTION

Vibratory meters, such as Coriolis flow meters and densitometers, and the meter assemblies that are part of the vibratory meters, are typically verified to ensure proper functionality and measurement accuracy. Environmental factors, such as variations in temperature, may affect the accuracy of the vibratory meter and the verification methods. For example, one factor that may affect a resonant frequency in a vibratory meter is the tube stiffness, which is a measure of structural integrity and resistance to load. When the stiffness changes due to, for example, temperature variations, flow verification factors also change and, therefore, the measurement may be altered.

The meter assemblies contained inside of the vibratory meters typically operate by detecting motion of a vibrating conduit that contains a material, which may or may not be flowing. Properties associated with the material in the conduit, such as mass flow, density, and the like, can be determined by pickoff signals received from pickoffs associated with the conduit. The pickoff signals are typically received by a meter electronics (also typically referred to as a transmitter) in communication with the meter assembly. The vibration modes of the vibrating meter assembly are generally affected by the combined mass, stiffness, and damping characteristics of the conduit and the material contained therein.

A typical vibratory meter includes one or more conduits that are connected inline in a pipeline or other transport system and convey material, such as fluids, slurries, emulsions, and the like, in the meter assembly. Each conduit may be viewed as having a set of natural vibration modes, including for example, simple bending, torsional, radial, and coupled modes. In a typical Coriolis mass flow measurement application, a conduit is excited in one or more vibration modes as a material flows through the conduit, and motion of the conduit is measured at points spaced along the conduit. The excitation is typically provided by a drive mechanism, such as a voice coil-type actuator comprised of a drive coil and magnet that perturbs the conduits in a periodic fashion.

The drive coil and magnet may be located between the conduits and drive the conduits at a resonance frequency. A feedback control system in the transmitter of the vibratory meter electronics may apply a sinusoidal current to the drive coil to maintain resonance at a specific amplitude. Two pickoff coils and magnets produce a voltage in response to the resonance frequency. The pickoffs are used to provide the feedback signal to control amplitude. The meter electronics may include a digital signal processor that uses the pickoff responses to determine a frequency of vibration used in the density measurement, as well as the time delay or phase difference between the two pickoff sinusoids needed to determine the mass flow rate. Vibratory meters offer high accuracy for single phase flows. However, the vibratory meter must be properly installed and verified to ensure a desirable degree of accuracy.

One means of meter verification is to measure the stiffness of the conduits within the vibratory meter. The meter verification typically involves measuring a stiffness of the conduits and compare the measured stiffness to a baseline stiffness. The baseline stiffness is typically measured at a factory. If the vibratory meter stiffness is equal to the factory baseline, the vibratory meter is verified as being able to meet its measurement accuracy specification. Accordingly, such meter verification serves to confirm the accuracy and structural integrity of a vibratory meter.

The meter verification may be performed by generating and injecting one or more test tones on either side of the drive frequency of the conduits. The test tones may be generated by a signal generator. The generated test tones may be amplified by a drive amplifier in the meter electronics. These test tones excite off-resonance responses in the pickoffs. The meter electronics measures the test tone and responses from the pickoffs. By measuring the response of the pickoffs and generating the corresponding frequency response function, the stiffness of the conduits can be estimated.

When meter verification is performed at a temperature higher than room temperature, resistance inside the drive coil increases. This increase in resistance will cause an increase in the power required to induce a desirable response amplitude. This increase can cause the power to exceed the maximum output of the drive amplifier. Power that exceeds the maximum output may saturate the drive voltage and over drive the amplifier, which causes the drive amplifier to clip the voltage waveform. Such signal clipping introduces large amounts of noise into the stiffness estimates. This produces errors and bias into the stiffness estimates which increases stiffness uncertainty. Accordingly, there is a need for temperature compensation of the test tones used in meter verification.

SUMMARY OF THE INVENTION

A method for temperature compensation of a test tone used in meter verification is provided. According to an embodiment, the method comprises using a drive amplifier to provide a drive signal to a drive circuit, wherein the drive circuit includes a drive mechanism in a meter assembly of a vibratory meter, measuring a first maximum amplitude of the drive signal at a first temperature of the drive circuit, measuring a second maximum amplitude of the drive signal at a second temperature of the drive circuit, and determining a maximum amplitude-to-temperature relationship for the drive circuit based on the first maximum amplitude at the first temperature and the second maximum amplitude at the second temperature.

A method for temperature compensation of a test tone used in meter verification is provided. According to an embodiment, the method comprises determining a resistance-to-temperature relationship of a drive circuit configured to receive a drive signal from a drive amplifier, wherein the drive circuit includes a drive mechanism in a meter assembly of a vibratory meter, determining a maximum output of the drive amplifier, and determining a maximum amplitude of the drive signal based on the resistance-to-temperature relationship and the maximum output of the drive amplifier.

A method for temperature compensation of a test tone used in meter verification is provided. According to an embodiment, the method comprises measuring a temperature of a drive circuit configured to receive a drive signal from a drive amplifier, wherein the drive circuit includes a drive mechanism in a meter assembly of a vibratory meter, obtaining a maximum amplitude-to-temperature relationship, determining a maximum amplitude based on the measured temperature of the drive circuit and the maximum amplitude-to-temperature relationship, and setting a maximum amplitude of the drive signal provided by the drive amplitude to the determined maximum amplitude.

ASPECTS OF THE INVENTION

According to an aspect, a method for temperature compensation of a test tone used in meter verification comprises using a drive amplifier to provide a drive signal to a drive circuit, wherein the drive circuit includes a drive mechanism in a meter assembly of a vibratory meter. The method also comprises measuring a first maximum amplitude of the drive signal at a first temperature of the drive circuit, measuring a second maximum amplitude of the drive signal at a second temperature of the drive circuit, and determining a maximum amplitude-to-temperature relationship for the drive circuit based on the first maximum amplitude at the first temperature and the second maximum amplitude at the second temperature.

Preferably, the drive signal comprises a resonant drive signal and one or more test tones, the one or more test tones being at a frequency that is different than a frequency of the resonant drive signal.

Preferably, the first maximum amplitude is an amplitude of the one or more test tones and the second maximum amplitude is the amplitude of the one or more test tones.

Preferably, measuring the first maximum amplitude of the drive signal at the first temperature comprises increasing an amplitude of the drive signal at the first temperature until the amplitude of the drive signal is clipped and measuring an amplitude less than the amplitude at which the amplitude of the drive signal is clipped, and measuring the second maximum amplitude of the drive signal at the second temperature comprises increasing the amplitude of the drive signal at the second temperature until the amplitude is clipped and measuring the amplitude of the drive signal that is less than the amplitude at which the amplitude of the drive signal is clipped.

Preferably, determining the maximum amplitude-to-temperature relationship for the drive circuit based on the first maximum amplitude at the first temperature and the second maximum amplitude at the second temperature comprises performing linear interpolation based on the first maximum amplitude at the first temperature and the second maximum amplitude at the second temperature.

Preferably, at least one of the first maximum amplitude and the second maximum amplitude comprises a maximum amplitude of a test tone in the drive signal.

According to an aspect, a method for temperature compensation of a test tone used in meter verification comprises determining a resistance-to-temperature relationship of a drive circuit configured to receive a drive signal from a drive amplifier, wherein the drive circuit includes a drive mechanism in a meter assembly of a vibratory meter, determining a maximum output of the drive amplifier, and determining a maximum amplitude of the drive signal based on the resistance-to-temperature relationship and the maximum output of the drive amplifier.

Preferably, determining the maximum amplitude of the drive signal based on the resistance-to-temperature relationship and the maximum output of the drive amplifier comprises determining a maximum amplitude-to-temperature relationship based on the resistance-to-temperature relationship and the maximum output of the drive amplifier.

Preferably, determining the resistance-to-temperature relationship of the drive circuit configured to receive the drive signal from the drive amplifier comprises determining a resistance of at least one of a drive resistor, a drive mechanism, and a lead between the drive amplifier and the drive mechanism.

Preferably, determining the maximum amplitude of the drive signal based on the resistance-to-temperature relationship and the maximum output of the drive amplifier comprises measuring a temperature of the drive circuit and determining a resistance of the drive circuit based on the measured temperature and the resistance-to-temperature relationship and calculating the maximum amplitude of the drive signal based on the determined resistance of the drive circuit at the measured temperature.

Preferably, the resistance-to-temperature relationship comprises linear relationship between a temperature of the drive circuit and a resistance of the drive circuit.

Preferably, the maximum amplitude of the drive signal comprises a maximum amplitude of a test tone in the drive signal.

According to an aspect, a method for temperature compensation of a test tone used in meter verification comprises measuring a temperature of a drive circuit configured to receive a drive signal from a drive amplifier, wherein the drive circuit includes a drive mechanism in a meter assembly of a vibratory meter, obtaining a maximum amplitude-to-temperature relationship, determining a maximum amplitude based on the measured temperature of the drive circuit and the maximum amplitude-to-temperature relationship, and setting a maximum amplitude of the drive signal provided by the drive amplitude to the determined maximum amplitude.

Preferably, obtaining the maximum amplitude-to-temperature relationship comprises determining a maximum amplitude-to-temperature relationship for the drive circuit based on a first maximum amplitude of the drive signal at a first temperature and a second maximum amplitude of the drive signal at a second temperature.

Preferably, determining the maximum amplitude based on the measured temperature of the drive circuit and the maximum amplitude-to-temperature relationship comprises determining a resistance of the drive circuit at the measured temperature and determining the maximum amplitude based on the determined resistance of the drive circuit at the measured temperature.

Preferably, determining the maximum amplitude based on the measured temperature of the drive circuit and the maximum amplitude-to-temperature relationship comprises determining a maximum amplitude of at least one test tone in the drive signal.

Preferably, setting the maximum amplitude of the drive signal comprises setting a maximum amplitude of a test tone in the drive signal.

Preferably, setting the maximum amplitude of the drive signal comprises writing a value to at least one of a processor and a memory in a meter electronics that provides the drive signal to the drive mechanism.

BRIEF DESCRIPTION OF THE DRAWINGS

The same reference number represents the same element on all drawings. It should be understood that the drawings are not necessarily to scale.

DETAILED DESCRIPTION OF THE INVENTION

FIGS. 1-8 and the following description depict specific examples to teach those skilled in the art how to make and use the best mode of embodiments for temperature compensation of a test tone used in meter verification. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of the temperature compensation of the test tone used in meter verification. As a result, the embodiments described below are not limited to the specific examples described below, but only by the claims and their equivalents.

Figure 1:
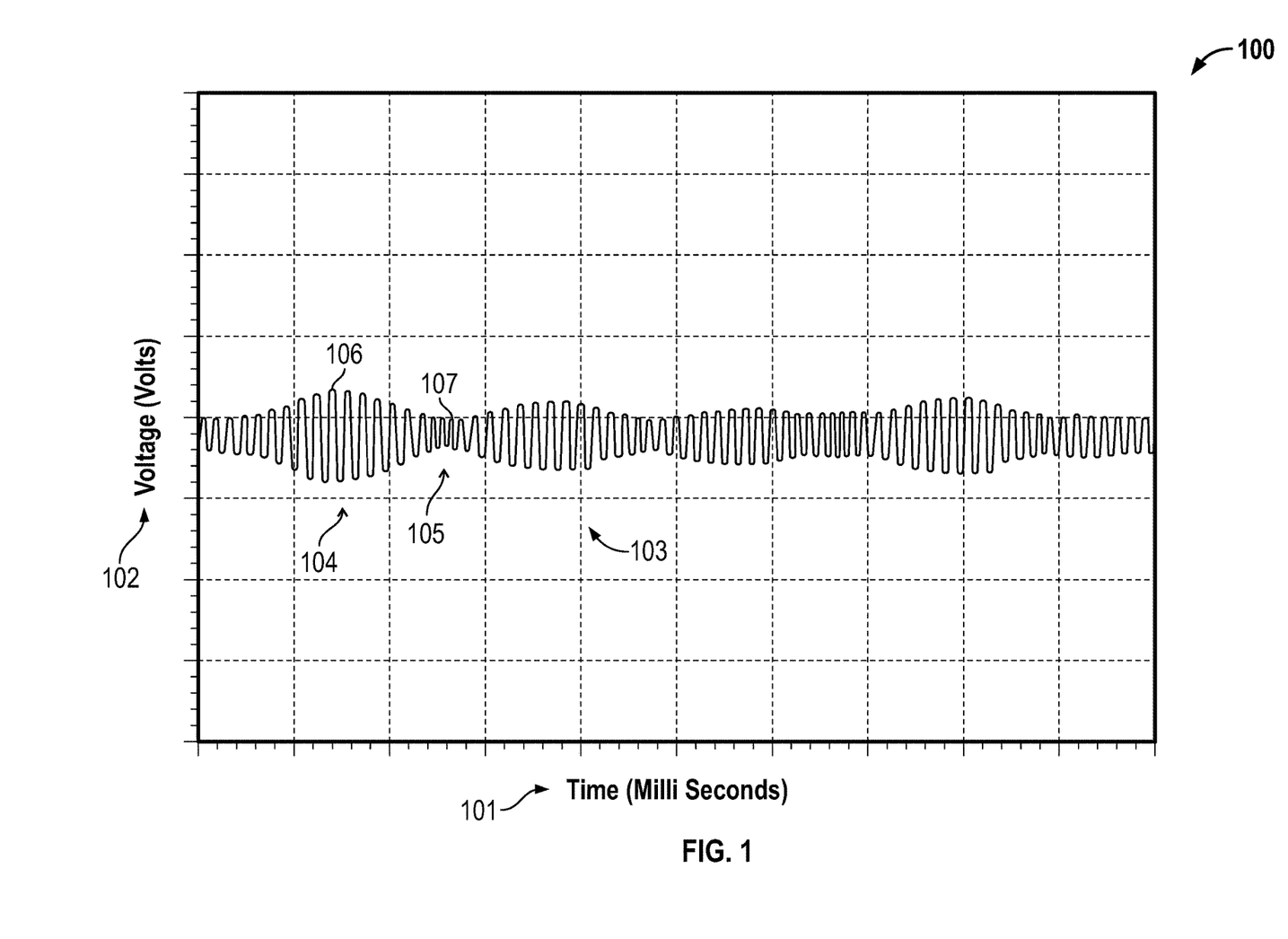
FIG. 1 shows a graph 100 with a waveform illustrating tone stacking during meter verification.

FIG. 1 shows a graph 100 with a waveform illustrating tone stacking during meter verification. As shown in FIG. 1, the graph 100 illustrates a drive signal waveform 103 which results after the process of tone stacking is performed. The horizontal axis 101 represents time in units of milliseconds. Time may also be represented in any portion of seconds, minutes or hours, or other unit. The vertical axis 102 represents the voltage. The voltage of the drive signal waveform 103 varies between a maximum amplitude 106 that occurs at a crest 104 of the drive signal waveform 103, and a minimum amplitude 107 which occurs at a trough 105 of the drive signal waveform 103. These fluctuations in the amplitude of the drive signal waveform 103 is due to tone stacking.

Tone stacking occurs when test tones are injected into a resonant drive signal. Due to the injected test tones, constructive and destructive interference occurs between the test tones and the resonant drive signal. When constructive interference occurs, the peaks of the injected test tones and the resonant drive signal are added together to form the crest 104. The maximum amplitude 106 of the crest 104 may be beyond the capacity of the amplifier to process, which causes signal clipping (e.g., voltage clipping, current clipping, power clipping, etc.). When destructive interference occurs, the troughs 105 of the drive signal waveform 103 are formed. The minimum amplitude 107 of the trough 105 may be a voltage that is small enough that noise overwhelms the pickoff sensor signal, resulting in a low signal-to-noise ratio. The minimum amplitude 107 may also be too low to excite the pickoff sensors in the vibratory meter. Such a result will increase the uncertainty in the stiffness readings making the readings unusable for verification of the vibratory meter. As a result, test tone amplitudes that are too large or too small increase the uncertainty of stiffness measurements.

Figure 2:
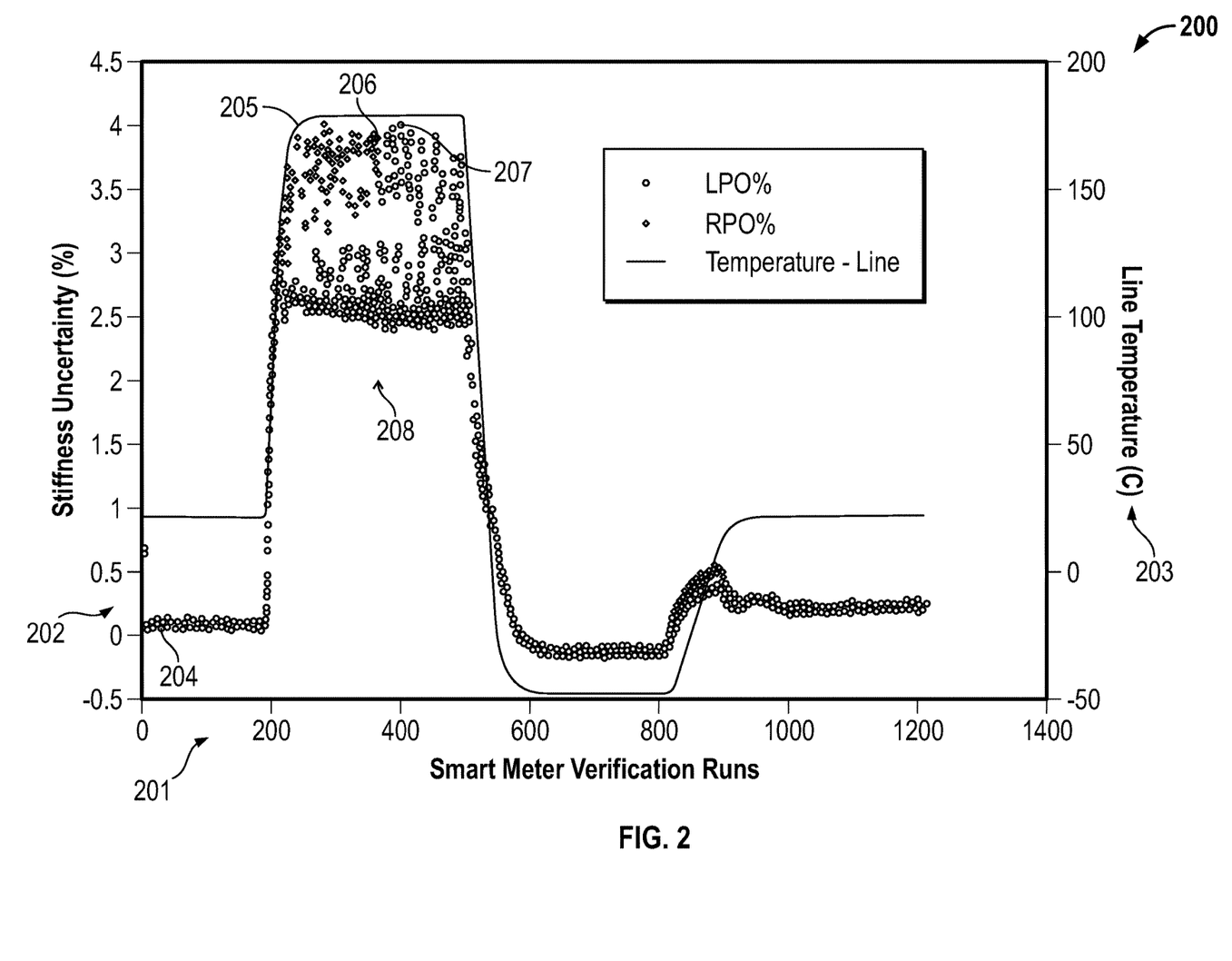
FIG. 2 shows a graph 200 of test data from an environmental test to compare stiffness uncertainty with temperature.

FIG. 2 shows a graph 200 of test data from an environmental test to compare stiffness uncertainty with temperature. The graph 200 includes an x-axis 201 representing a plurality of individual smart meter verification tests, known in the art as smart meter verification (SMV) runs. The graph 200 also includes a left axis 202 representing stiffness uncertainty as a percentage, where uncertainty of the stiffness reading increases up the left axis 202. The right axis 203 represents the changing independent variable of temperature in degrees Celsius. A temperature line 205 represents the temperature during the SMV runs.

Each run produced a pair of points, one being a diamond shaped point 206 and the other being a circle shaped point 207. The diamond shaped point 206 represents the right pickoff signal and the circle shaped point 207 represents a left pickoff signal. Some nominal runs 204 performed at a nominal temperature have values within the acceptable stiffness uncertainty, while a temperature-affected run 208 has values that may be beyond the acceptable stiffness uncertainty limit. As can be appreciated, the uncertainty of the stiffness reading increases as temperature increases. This is due to the signal clipping of the drive signal. The points 206, 207 plotted on the graph 200 indicate that stiffness uncertainty may be above or within an acceptable margin of uncertainty, which may be 1.5 percent. Above 1.5 percent, the stiffness readings are too uncertain for meter verification purposes.

By way of explanation, as temperature increases, entropy increases within the atomic structure of metals inside of electronic devices and within the accompanying wiring. Increased entropy increases resistance to electric current. For example, resistance may double as temperature changes from ambient temperature to 180° C. Since resistance is proportionally related to voltage by Ohm's law of V=IR, where voltage equals current times resistance, any increase in resistance will result in an increase in voltage. Maintaining the same or constant voltage will reduce current by an amount proportional to the increase in resistance. In a similar manner, since resistance is related to power by Joule's Law of $P=I^2R$, where power equals current squared times resistance, an increased resistance significantly increases the power required to drive the vibratory meter.

Referring to FIG. 2 as an example, the points 206, 207 and the temperature line 205 indicate that the uncertainty of the stiffness readings increases as temperature increases. For example, a temperature of approximately 180° C. produces the stiffness uncertainty of about 4 percent. The 4 percent stiffness uncertainty exceeds the acceptable limit of a 1.5 percent stiffness uncertainty. The increase in stiffness uncertainty reading at higher temperatures is due to signal clipping. In order to correct for the stiffness uncertainty caused by signal clipping, the tone level must be optimized to decrease or eliminate the signal clipping.

Figure 3:
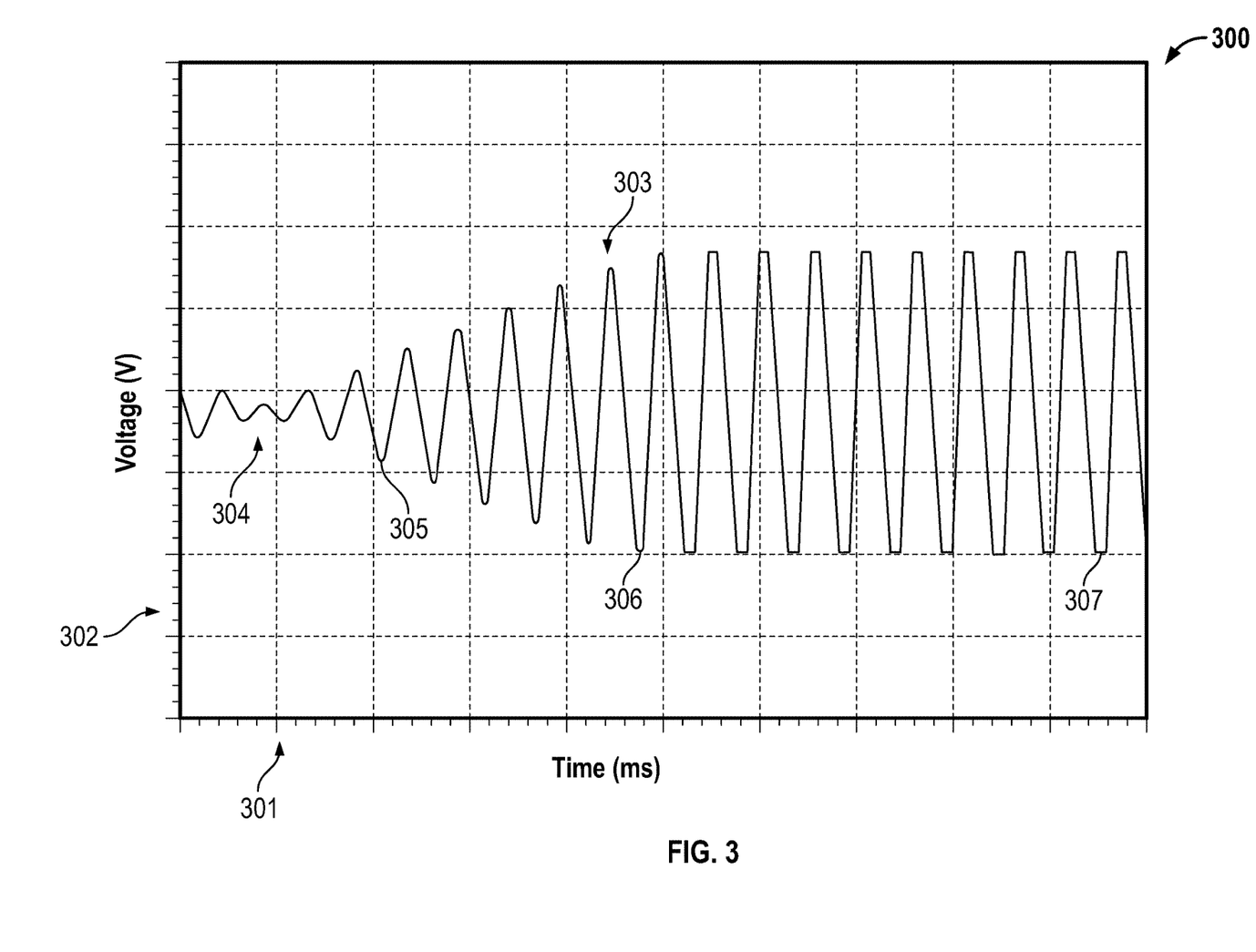
FIG. 3 shows a graph 300 illustrating an example of the signal clipping due to a non-optimized tone level.

FIG. 3 shows a graph 300 illustrating an example of the signal clipping due to a non-optimized tone level. The graph 300 includes a horizontal x-axis 301 representing time in milliseconds and the y-axis 302 represents voltage of the drive signal. The noisy stiffness uncertainty is created by non-optimal tone level for the environmental conditions. The graph 300 shows a drive signal waveform 303 with a low amplitude 304. Also shown is an amplitude 305 of the drive signal waveform 303, which may increase to a maximum amplitude 306. The voltage may be large enough to cause a signal clipping 307.

The drive signal waveform 303 initially has the low amplitude 304. As shown, the amplitude 305 increases to the maximum amplitude 306. The amplitude 305 of the drive signal waveform 303 will also increase as resistance in the drive circuit increases. As the voltage increases, a point may be reached where the amplitude 305 exceeds the maximum output of the drive amplifier, which results in signal clipping 307. When the signal clipping 307 occurs, the smooth sinusoidal waveform begins to lose the crispness at the peaks and troughs. The peaks and troughs of the drive signal waveform 303 begin to flatten out and the drive signal waveform 303 may begin to look and act as a square wave waveform.

The signal-to-noise ratio may be a ratio of signal power to noise power expressed in decibels. A signal-to-noise ratio greater than 1:1 indicates more signal than noise exists in the signal. The higher the signal-to-noise ratio, the clearer the signal will be.

When a signal power is increased, the signal-to-noise ratio also increases until a point at which the signal begins to distort. The maximum amplitude 306 or tone level occurs at the point when power is increased to the point until just before the signal clipping 307 occurs. Any point above the maximum amplitude 306 or optimal tone level introduces the signal clipping 307.

A non-optimal test tone may also occur below the optimal signal-to-noise ratio. For example, the low amplitude 304 may fail to adequately excite the pickoffs thereby causing an unacceptably low signal-to-noise ratio. As voltage is increased or as additional tones are injected into the test tone, the amplitude 305 of the drive signal waveform 303 increases. The optimal tone level is identified when a signal provides the optimal signal-to-noise ratio at the maximum amplitude 306, which is before the signal clipping 307. The amplitude of the signal clipping 307 may vary due to, for example, changes in environmental conditions that affect a maximum output of the drive amplifier.

Figure 4:
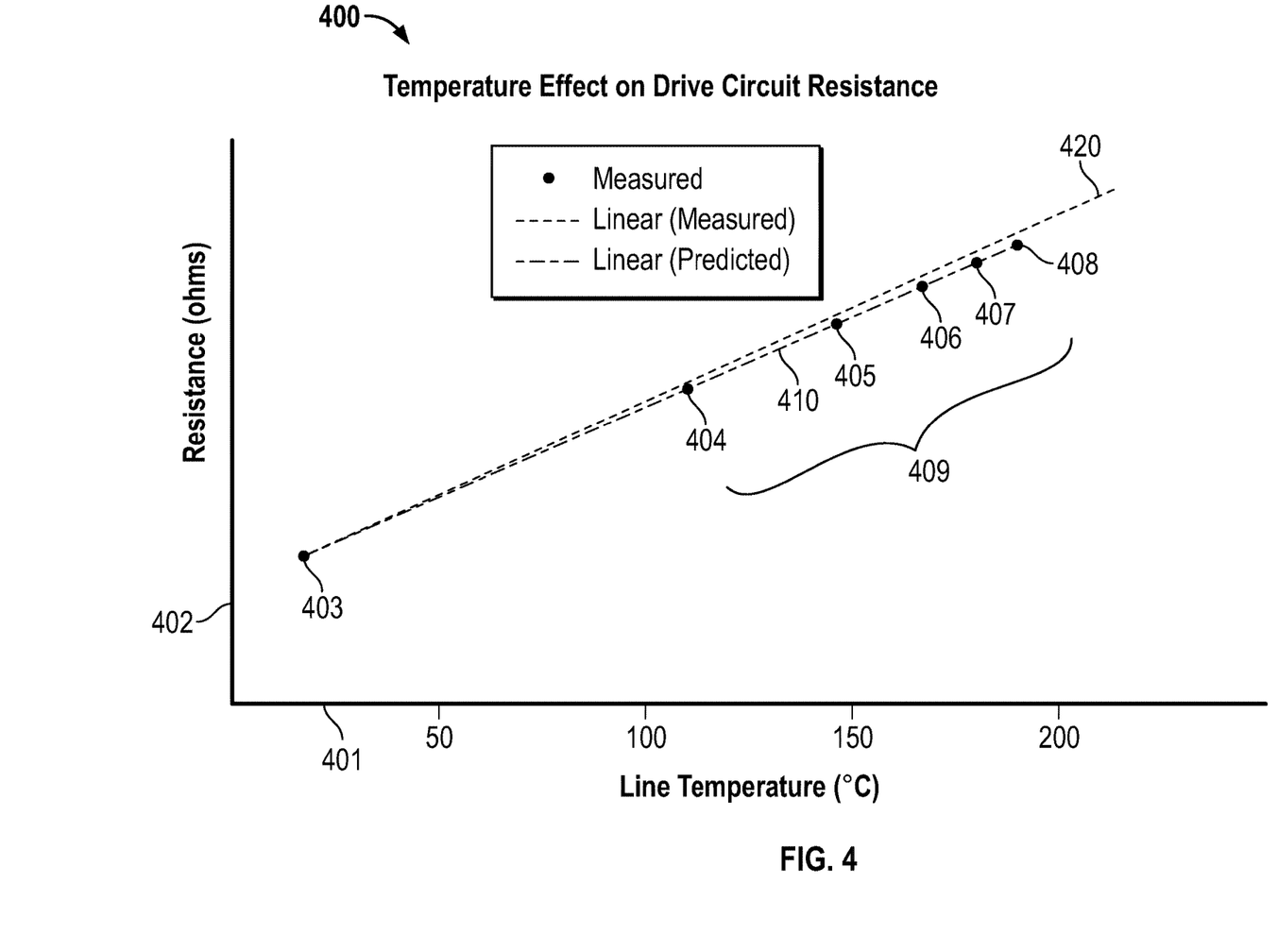
FIG. 4 presents a chart 400 illustrating the linearity of measured resistance of a drive circuit for a vibratory meter between 20° C. and 180° C.

FIG. 4 presents a chart 400 illustrating the linearity of measured resistance of a drive circuit for a vibratory meter between 20° C. and 180° C. The x-axis 401 represents the line temperature in degrees Celsius. The y-axis 402 represents the resistance in ohms. The chart 400 plots a collection 409 of measured data points 403, 404, 405, 406, 407, 408. These data points 409 are connected by an empirical line 410. Also shown is a model line 420, which is determined using an electrical circuit model of the drive circuit.

The empirical line 410 may be determined using the measured data points 403, 404, 405, 406, 407, 408 using a linear regression. An R-squared value may also be calculated to determine how accurate the linear measure is to fit the data points, although any suitable regression analysis may be employed, including non-linear regression analysis. The measured data points 403, 404, 405, 406, 407, 408 suggest that resistance of the drive circuit is linear with respect to temperature. With the linear relationship between temperature and resistance within copper wire, it is possible to implement temperature compensation for the drive signal amplitude using the model line 420 instead of the empirical line 410.

Figure 5:
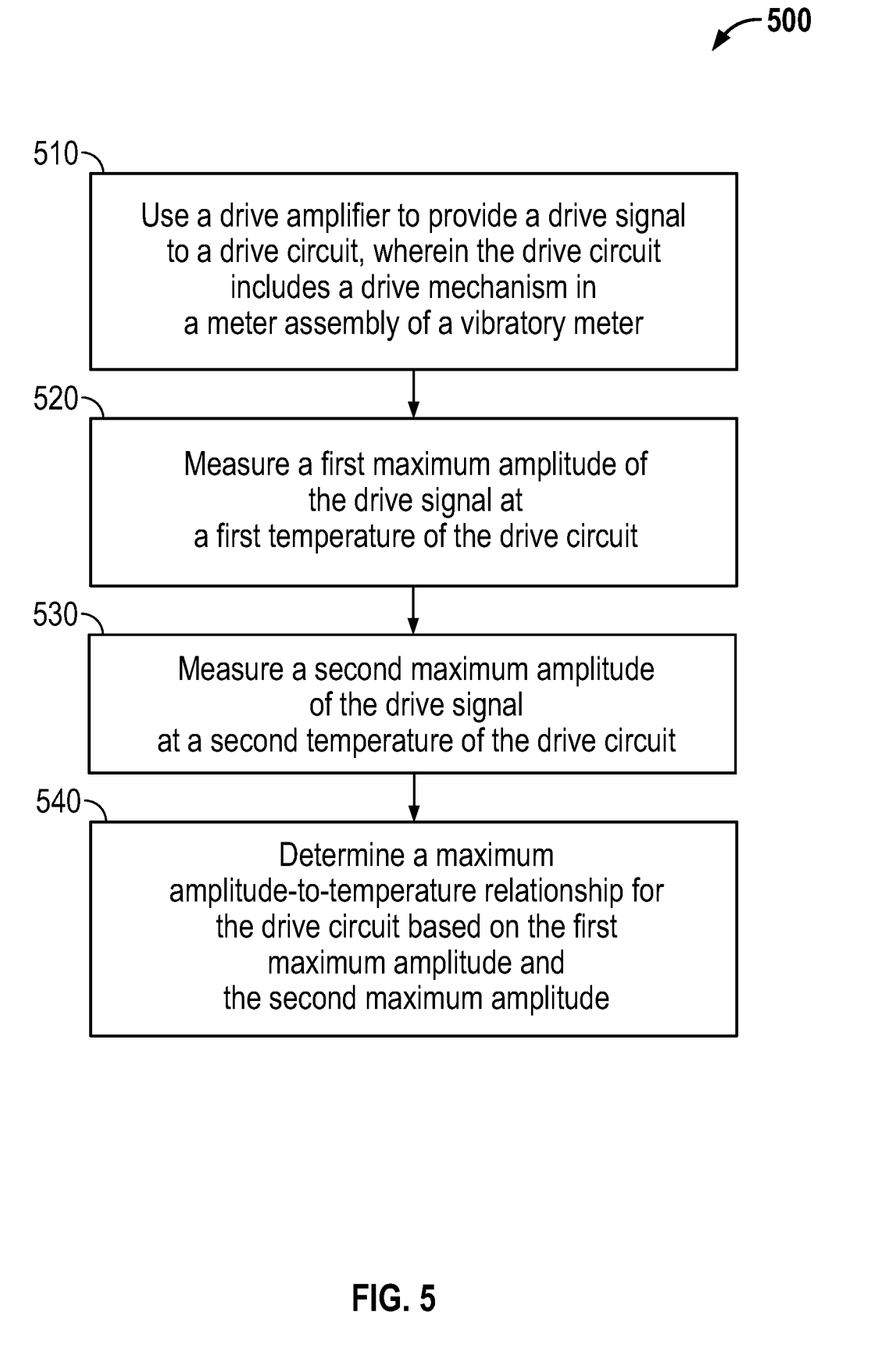
FIG. 5 shows a method 500 for temperature compensation of a test tone used in meter verification.

FIG. 5 shows a method 500 for temperature compensation of a test tone used in meter verification. In step 510, the method 500 uses a drive amplifier to provide a drive signal to a drive circuit, wherein the drive circuit includes a drive mechanism in a meter assembly of a vibratory meter. The drive signal may include a resonant component and one or more test tones. The drive signal may be provided at a first temperature such as, for example, −60° C., although any suitable temperatures may be employed in alternative embodiments. The −60° C. temperature may be achieved by placing the entire vibratory meter, or a portion thereof, in an environmental chamber.

In step 520, the method measures a first maximum amplitude of the drive signal at a first temperature of the drive circuit. For example, the drive signal with the test tone may be measured by a sensor, an oscilloscope, or other such monitoring device is used to view and/or measure an amplitude of the drive signal. The amplitude of the drive signal may then be adjusted using the tone injection tone stacking procedure described with reference to FIG. 1 in order to maximize the amplitude, although any suitable procedure may be employed. The amplitude may be maximized to a point just prior to the onset of signal clipping. The maximum amplitude of the drive signal and first temperature may then be measured. The amplitudes of one or more tests tones may also be measured.

In step 530, the method 500 measures a second maximum amplitude of the drive signal at a second temperature of the drive circuit. For example, the vibratory meter, or a portion thereof, such as the meter assembly, may be placed in a temperature chamber and heated to a temperature of 200° C. The drive voltage is then monitored and the resultant voltage signal is monitored. The amplitude of the drive signal is then increased until signal clipping appears. The amplitude of the drive signal may be increased by increasing an amplitude of one or more test tones. The amplitude of the drive signal and/or one or more test tones is recorded or captured as the maximum amplitude before saturation at this temperature.

In step 540, the method 500 determines a maximum amplitude-to-temperature relationship for the drive circuit based on the first maximum amplitude-to-temperature value and the second maximum amplitude-to-temperature value. For example, linear regression may be performed using the first and second maximum amplitude-to-temperature values to determine a linear equation, the linear equation being the maximum amplitude-to-temperature relationship. However, the maximum amplitude-to-temperature relationship may be any suitable relationship, such as, for example, a lookup table. The maximum amplitude-to-temperature relationship may be a relationship between the amplitude of one or more test tones in the drive signal and the temperature.

Figure 6:
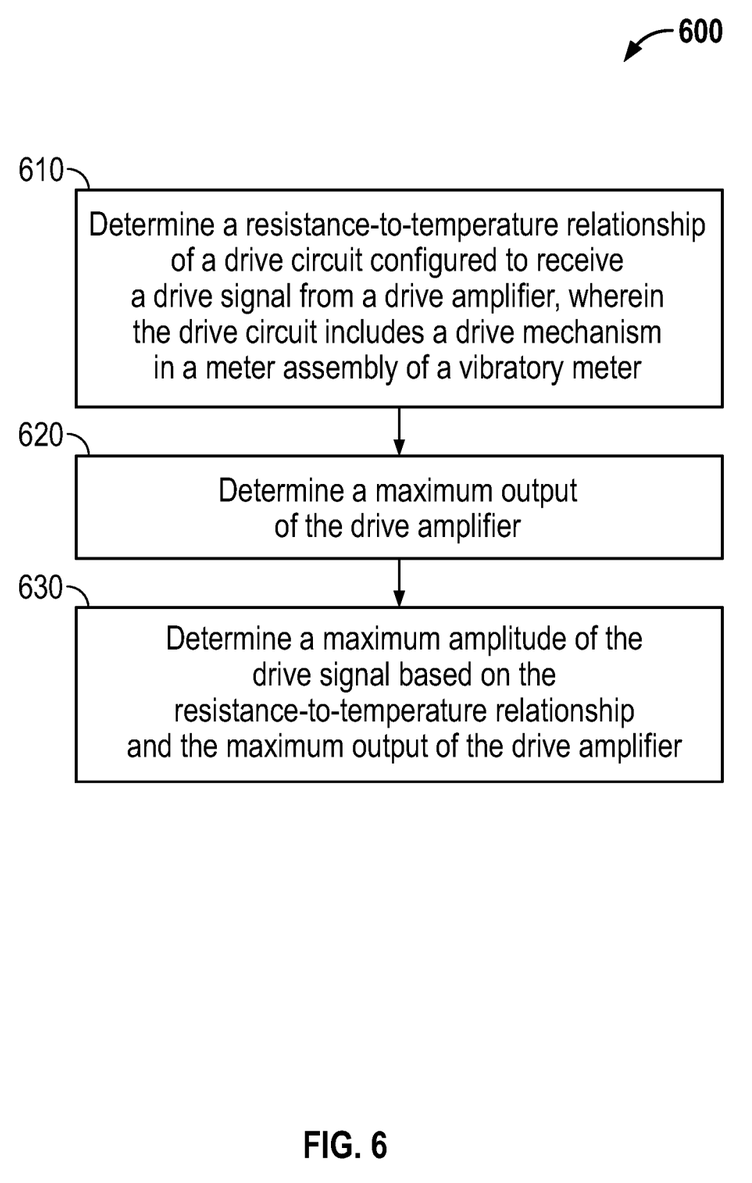
FIG. 6 shows a method 600 for temperature compensation of a test tone used in meter verification.

FIG. 6 shows a method 600 for temperature compensation of a test tone used in meter verification. As shown in FIG. 6, the method 600 determines a resistance-to-temperature relationship of a drive circuit configured to receive a drive signal from a drive amplifier, wherein the drive circuit includes a drive mechanism in a meter assembly of a vibratory meter, in step 610. For example, the method 600 can read a formula from a memory into a processor. The formula may be determined using the method 500 described above.

In step 620, the method 600 determines a maximum output of the drive amplifier. The maximum output power of the drive amplifier may be determined, for example, by reading a stored value in the memory, obtaining the value from the drive amplifier, or the like. The maximum output of the drive amplifier may be in units of, for example, watts, volts, amps, etc.

In step 630, the method 600 determines a maximum amplitude of the drive signal based on the resistance-to-temperature relationship and the maximum output of the drive amplifier. For example, a maximum amplitude-to-temperature relationship may be determined based on the resistance-to-temperature relationship and the maximum output of the drive amplifier. Additionally or alternatively, the maximum amplitude of the drive signal may comprise measuring a temperature of the drive circuit and determining a resistance of the drive circuit based on the measured temperature and the resistance-to-temperature relationship and calculating the maximum amplitude of the drive signal based on the determined resistance of the drive circuit and the measured temperature.

Figure 7:
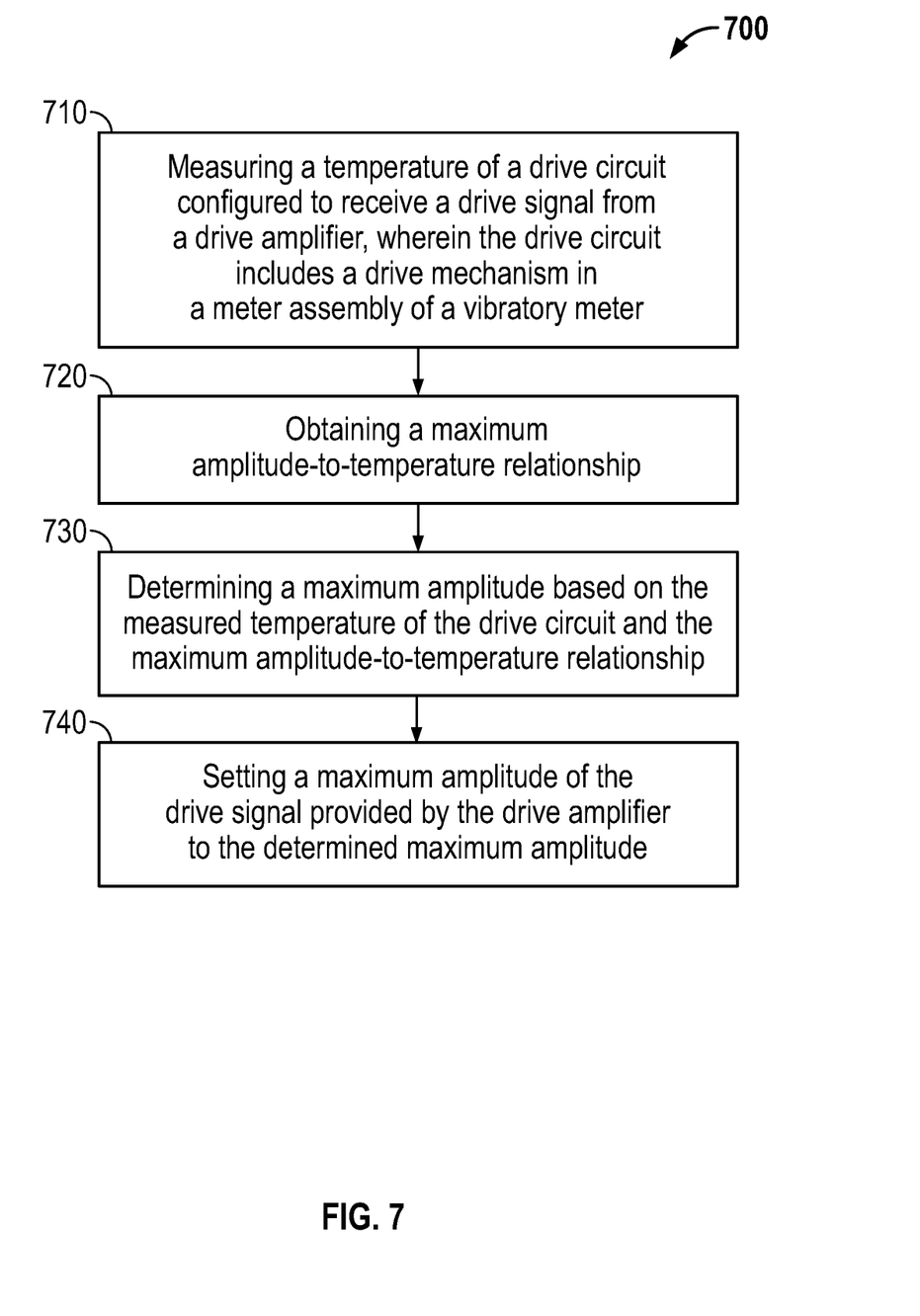
FIG. 7 shows a method 700 for temperature compensation of a test tone used in meter verification.

FIG. 7 shows a method 700 for temperature compensation of a test tone used in meter verification. The method 700, in step 710, measures a temperature of a drive circuit configured to receive a drive signal from a drive amplifier, wherein the drive circuit includes a drive mechanism in a meter assembly of a vibratory meter. The temperature may be measured at any portion of the drive circuit, which is described in more detail in the following. For example, a temperature in a meter assembly may be measured by a resistance temperature detector (RTD). Additionally or alternatively, other temperature sensors may be employed.

In step 720, the method 700 obtains a maximum amplitude-to-temperature relationship. Obtaining the maximum amplitude-to-temperature relationship may comprise determining a maximum amplitude-to-temperature relationship for the drive circuit based on a first maximum amplitude of the drive signal at a first temperature and a second maximum amplitude of the drive signal at a second temperature. The maximum amplitude-to-temperature relationship may be determined and stored in the meter electronics by, for example, the methods described above.

In step 730, the method 700 determines a maximum amplitude based on the measured temperature of the drive circuit and the maximum amplitude-to-temperature relationship. Determining the maximum amplitude based on the measured temperature of the drive circuit and the maximum amplitude-to-temperature relationship may comprise determining a resistance of the drive circuit at the measured temperature and determining the maximum amplitude based on the determined resistance of the drive circuit at the measured temperature. Determining the maximum amplitude based on the measured temperature of the drive circuit and the maximum amplitude-to-temperature relationship may comprise determining a maximum amplitude of at least one test tone in the drive signal.

In step 740, the method 700 sets a maximum amplitude of the drive signal provided by the drive amplifier to the determined maximum amplitude. Setting the maximum amplitude of the drive signal may comprise setting a maximum amplitude of a test tone in the drive signal. The meter electronics may limit the maximum amplitude of one or more test tones to be less than or equal to a value that is stored in memory. For example, setting the maximum amplitude of the drive signal may comprise writing a value to at least one of a processor and a memory in a meter electronics that provides the drive signal to the drive mechanism, which is described in more detail in the following with reference to FIG. 8.

The method 700 ensures that the drive signal will not clip under any operating temperature and thus will automatically provide the optimal signal-to-noise ratio. The method 700 can be implemented in various vibratory meters, but may advantageously be most applicable for vibratory meters with low overhead and a large sized drive resistor such as, but not limited to, a meter using long lengths of 9-wire cable. The method 700 serves to reduce noise, increase signal-to-noise ratio, and reduce stiffness uncertainty below the uncertainty limit.

Implementation of the methods 500, 600, 700 may require that three new computer operable memory registers be incorporated into a testing meter in addition to the one memory register which exists in the current meters that are used. A total of four registers are needed in order to accommodate four coefficients comprising two temperature coefficients and two tone level coefficients. Software code may also be incorporated into a meter to implement the interpolation mathematics.

Figure 8:
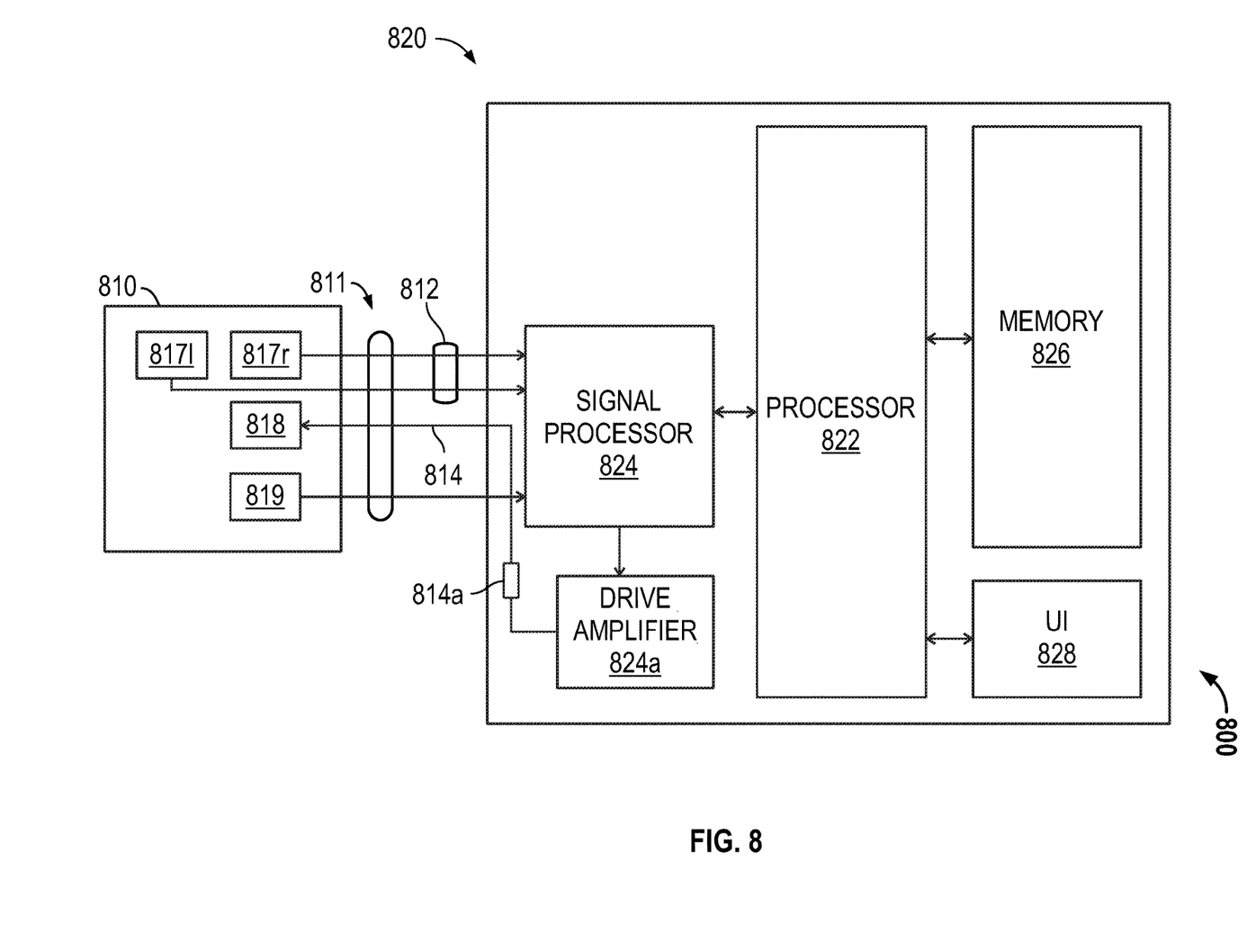
FIG. 8 shows a block diagram of a vibratory sensor system 800.

FIG. 8 shows a block diagram of a vibratory sensor system 800. As shown in FIG. 8, the vibratory sensor system 800 includes a meter assembly 810 and meter electronics 820. The meter electronics 820 is communicatively coupled to the meter assembly 810. The meter assembly 810 includes a left and right pick-off sensor 817$l$, 817$r$, drive mechanism 818, and temperature sensor 819, which are communicatively coupled to the meter electronics 820 via a set of leads 811. The meter electronics 820 controls a drive signal provided via the leads 811. More specifically, the meter electronics 820 is configured to control a drive signal provided to the drive mechanism 818 in the meter assembly 810. The drive signal is provided via a drive circuit 814, which may be comprised of an electrical circuit, including cable harnesses including the leads 811, and a portion of the meter electronics 820, such as a drive resistor 814a shown in FIG. 8. In addition, a sensor signal 812 is provided by the meter assembly 810. More specifically, in the embodiment shown, the sensor signal 812 is provided by the left and right pick-off sensor 817$l$, 817$r$ in the meter assembly 810.

The meter electronics 820 includes a processor 822 communicatively coupled to a signal processor 824. The signal processor 824 is configured to receive and digitize the sensor signal 812 from the meter assembly 810. The signal processor 824 is also configured to provide the digitized sensor signal to the processor 822. The signal processor 824 is also communicatively coupled to a drive amplifier 824a. The drive amplifier 824a is configured to provide the drive signal to the drive mechanism 818 in the meter assembly 810. The drive amplifier 824a is configured to vibrate conduits by generating and providing the drive signal via the drive circuit 814, which is shown as including the drive resistor 814a. The drive resistor 814a may be required for safety regulation reasons.

The processor 822 is communicatively coupled to a memory 826. The processor 822 is also communicatively coupled to a user interface 828. The processor 822 may be a microprocessor although any suitable processor may be employed. For example, the processor 822 may be comprised of sub-processors, such as a multi-core processor, serial communication ports, peripheral interfaces (e.g., serial peripheral interface), on-chip memory, I/O ports, and/or the like. In these and other embodiments, the processor 822 is configured to perform operations on received and processed signals, such as digitized signals. The processor 822 is also configured to provide information, such as a phase difference, a property of a fluid in the meter assembly 810, or the like. The processor 822 may also be configured to communicate with the memory 826 to receive and/or store information in the memory 826.

The memory 826 may be comprised of a read-only memory (ROM), random access memory (RAM), and a ferroelectric random-access memory (FRAM). However, in alternative embodiments, the memory 826 may be comprised of more or fewer memories. Additionally or alternatively, the memory 826 may be comprised of different types of memory (e.g., volatile, non-volatile, etc.). For example, a different type of non-volatile memory, such as, for example, erasable programmable read only memory (EPROM), or the like, may be employed instead of the FRAM.

In operation, the resonant component and test tones of the drive signal may be generated by the signal processor 824 and provided to the drive amplifier 824a. The resonant component may be generated using a feedback loop of the pickoff signal provided by the pickoff sensors 817l, 817r. The drive amplifier 824a may amplify the drive signal (which includes the resonant component and the test tones) and provide the amplified drive signal to the drive mechanism 818 in the meter assembly 810. As shown in FIG. 8, the drive signal is provided via the drive circuit 814, which includes the drive resistor 814a.

As can be appreciated, a resistance of the drive circuit 814 includes the resistance of the drive circuit 814 portion of the leads 811, the drive resistor 814a, and the drive mechanism 818. As described above with reference to FIG. 2, the resistance of the drive circuit 814 will vary due to temperature changes. As a result, to induce a desired amplitude in the pickoff signal provided by the pickoff sensors 817l, 817r, the drive amplifier 824a may, for example, increase the current of the drive signal up to a maximum amplitude that may be determined and set using methods 500-700 described above.

As described above, a maximum amplitude determined by the methods 500, 600, 700 is an optimal drive amplitude in that the drive signal provided to the drive mechanism 818 is not clipped, even when test tones causes a crest, such as the crest 104 shown in FIG. 1. Therefore, the pickoff signal provided by the pickoff sensors 817l, 817r will not include noise caused by the signal clipping. Meter verification can therefore accurately measure the stiffness of the conduits in the meter assembly 810 and more accurately determine if the stiffness of the conduit has changed. That is, when the measured meter stiffness is compared to the baseline stiffness and there is a difference that indicates the conduit's stiffness has changed, this difference is likely due to an actual change in the conduit's stiffness and is not due to noise as a result of signal clipping.

In addition, since the determined maximum drive signal is optimal, the signal-to-noise ratio of the pickoff sensor signal is maximized. That is, as described with reference to FIG. 5, the method 500 determines the maximum amplitude-to-temperature relationship, where the maximum amplitude corresponds to an amplitude that is at or near the clipping amplitude of the drive signal. As a result, the amplitude of the drive signal is maximized up to the amplitude at which the voltage is clipped. This maximizes the signal-to-noise ratio while still ensuring that the pickoff signals will not have noise due to signal clipping.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein can be applied to other temperature compensation of a test tone used in meter verification and not just to the embodiments described above and shown in the accompanying figures. Accordingly, the scope of the embodiments described above should be determined from the following claims.

What is claimed is:

1. A method for temperature compensation of a test tone used in meter verification, the method comprising:
   using a drive amplifier to provide a drive signal to a drive circuit, wherein the drive circuit includes a drive mechanism in a meter assembly of a vibratory meter;
   measuring a first maximum amplitude of the drive signal at a first temperature of the drive circuit, the first maximum amplitude being an amplitude of the drive signal maximized just prior to the onset of signal clipping by the drive amplifier;
   measuring a second maximum amplitude of the drive signal at a second temperature of the drive circuit, the second maximum amplitude being an amplitude of the drive signal maximized just prior to the onset of signal clipping by the drive amplifier; and
   determining a maximum amplitude-to-temperature relationship for the drive circuit based on the first maximum amplitude at the first temperature and the second maximum amplitude at the second temperature.

2. The method of claim 1, wherein the drive signal comprises a resonant drive signal and one or more test tones, the one or more test tones being at a frequency that is different than a frequency of the resonant drive signal.

3. The method of claim 2, wherein the first maximum amplitude is an amplitude value of the one or more test tones and the second maximum amplitude is another amplitude value of the one or more test tones.

4. The method of claim 1, wherein:
   measuring the first maximum amplitude of the drive signal at the first temperature comprises increasing an amplitude of the drive signal at the first temperature until the amplitude of the drive signal is clipped and measuring an amplitude less than the amplitude at which the amplitude of the drive signal is clipped; and
   measuring the second maximum amplitude of the drive signal at the second temperature comprises increasing the amplitude of the drive signal at the second temperature until the amplitude is clipped and measuring the amplitude of the drive signal that is less than the amplitude at which the amplitude of the drive signal is clipped.

5. The method of claim 1, wherein determining the maximum amplitude-to-temperature relationship for the drive circuit based on the first maximum amplitude at the first temperature and the second maximum amplitude at the second temperature comprises performing linear interpolation based on the first maximum amplitude at the first temperature and the second maximum amplitude at the second temperature.

6. The method of claim 1, wherein at least one of the first maximum amplitude and the second maximum amplitude comprises a maximum amplitude of a test tone in the drive signal.

7. A method for temperature compensation of a test tone used in meter verification, the method comprising:
   determining a resistance-to-temperature relationship of a drive circuit configured to receive a drive signal from a drive amplifier, wherein the drive circuit includes a drive mechanism in a meter assembly of a vibratory meter;
   determining a maximum output of the drive amplifier; and
   determining a maximum amplitude of the drive signal based on the resistance-to-temperature relationship and the maximum output of the drive amplifier, the maximum amplitude being an amplitude of the drive signal maximized just prior to the onset of signal clipping by the drive amplifier.

8. The method of claim 7, wherein determining the maximum amplitude of the drive signal based on the resistance-to-temperature relationship and the maximum output of the drive amplifier comprises determining a maximum amplitude-to-temperature relationship based on the resistance-to-temperature relationship and the maximum output of the drive amplifier.

9. The method of claim 7, wherein determining the resistance-to-temperature relationship of the drive circuit configured to receive the drive signal from the drive amplifier comprises determining a resistance of at least one of a drive resistor, a drive mechanism, and a lead between the drive amplifier and the drive mechanism.

10. The method of claim 7, wherein determining the maximum amplitude of the drive signal based on the resistance-to-temperature relationship and the maximum output of the drive amplifier comprises measuring a temperature of the drive circuit and determining a resistance of the drive circuit based on the measured temperature and the resistance-to-temperature relationship and calculating the maximum amplitude of the drive signal based on the determined resistance of the drive circuit at the measured temperature.

11. The method of claim 7, wherein the resistance-to-temperature relationship comprises linear relationship between a temperature of the drive circuit and a resistance of the drive circuit.

12. The method of claim 7, wherein the maximum amplitude of the drive signal comprises a maximum amplitude of a test tone in the drive signal.

13. A method for temperature compensation of a test tone used in meter verification, the method comprising:
 measuring a temperature of a drive circuit configured to receive a drive signal from a drive amplifier, wherein the drive circuit includes a drive mechanism in a meter assembly of a vibratory meter;
 obtaining a maximum amplitude-to-temperature relationship;
 determining a maximum amplitude based on the measured temperature of the drive circuit and the maximum amplitude-to-temperature relationship, the maximum amplitude being an amplitude of the drive signal maximized just prior to the onset of signal clipping by the drive amplifier; and
 setting a maximum amplitude value of the drive signal provided by the drive amplifier to the determined maximum amplitude.

14. The method of claim 13, wherein obtaining the maximum amplitude-to-temperature relationship comprises determining a maximum amplitude-to-temperature relationship for the drive circuit based on a first maximum amplitude of the drive signal at a first temperature and a second maximum amplitude of the drive signal at a second temperature.

15. The method of claim 13, wherein determining the maximum amplitude based on the measured temperature of the drive circuit and the maximum amplitude-to-temperature relationship comprises determining a resistance of the drive circuit at the measured temperature and determining the maximum amplitude based on the determined resistance of the drive circuit at the measured temperature.

16. The method of claim 13, wherein determining the maximum amplitude based on the measured temperature of the drive circuit and the maximum amplitude-to-temperature relationship comprises determining a maximum amplitude of at least one test tone in the drive signal.

17. The method of claim 13, wherein setting the maximum amplitude value of the drive signal comprises setting a maximum amplitude value of a test tone in the drive signal.

18. The method of claim 13, wherein setting the maximum amplitude value of the drive signal comprises writing the maximum amplitude value to at least one of a processor and a memory in a meter electronics that provides the drive signal to the drive mechanism.

* * * * *